United States Patent [19]

Sanders et al.

[11] Patent Number: 5,282,944
[45] Date of Patent: Feb. 1, 1994

[54] ION SOURCE BASED ON THE CATHODIC ARC

[75] Inventors: David M. Sanders; Steven Falabella, both of Livermore, Calif.

[73] Assignee: The United States of America as represented by the United States Department of Energy, Washington, D.C.

[21] Appl. No.: 921,779
[22] Filed: Jul. 30, 1992
[51] Int. Cl.$^5$ .............................................. C23C 14/32
[52] U.S. Cl. ........................... 204/192.38; 204/298.41; 250/426; 313/153; 427/580
[58] Field of Search .................... 204/192.38, 298.41; 427/580; 313/153, 157; 250/426

[56] References Cited

U.S. PATENT DOCUMENTS

| | | | |
|---|---|---|---|
| 2,972,695 | 2/1961 | Wroe | 313/157 |
| 3,625,848 | 12/1971 | Snaper | 204/192.38 |
| 3,793,179 | 2/1974 | Sablev et al. | 204/298.41 |
| 4,180,450 | 12/1979 | Morrison, Jr. | 204/298.19 |
| 4,204,936 | 5/1980 | Hartsough | 204/192.12 |
| 4,221,652 | 9/1980 | Kuriyama | 204/298.22 |
| 4,430,184 | 2/1984 | Mularie | 204/192.38 |
| 4,452,686 | 6/1984 | Axenov et al. | 204/298.41 |
| 4,492,845 | 1/1985 | Kijuchko et al. | 219/121.36 |
| 4,544,468 | 10/1985 | Munz et al. | 204/192.12 |
| 4,551,221 | 11/1985 | Axenov et al. | 204/298.41 |
| 4,824,544 | 4/1989 | Mikalesen et al. | 204/298.06 |
| 4,855,033 | 8/1989 | Hurwitt | 204/298.09 |
| 4,892,633 | 1/1990 | Welty | 204/192.12 |
| 4,929,321 | 5/1990 | Buhl | 204/198.38 |

FOREIGN PATENT DOCUMENTS 0381912 8/1990 European Pat. Off. .
1204370 9/1986 Japan ............................ 427/523
2-125868 5/1990 Japan .

OTHER PUBLICATIONS

I. I. Aksenov et al., Tranport of Plasma Streams In A Curvilinear Plasma-Optics System, *Sov. J. Plasma Phys.* 4(4), Jul.-Aug. 1978, 425-428.
D. M. Sanders, Review of Ion-Based Coating Processes Derived from the Cathodic Arc, *J. Vac. Sci. Technol.* A7(3), Mar.-Jun. 1989, 2339-2345.
D. M. Sanders et al., Coating Technology Based on the Vacuum Arc-A Review, *IEEE Trans. On Plasma Science*, vol. 18, No. 6, Dec. 1990, 883-894.
D. M. Sanders et al., Coatings From Ions-Modeling and Experiments, UCRL-53868-90, Manuscript Date: Aug. 1991, 4-14 to 4-18.
S. Falabella et al., Comparison of Two Filtered Cathodic Arc Sources, *J. Vac. Sci., Technol.* A 10(2), Mar.-/Apr. 1992, 394-397.

Primary Examiner—Aaron Weisstuch
Attorney, Agent, or Firm—Henry P. Sartorio; Roger S. Gaither; William R. Moser

[57] ABSTRACT

A cylindrically symmetric arc source to produce a ring of ions which leave the surface of the arc target radially and are reflected by electrostatic fields present in the source to a point of use, such as a part to be coated. An array of electrically isolated rings positioned in the source serves the dual purpose of minimizing bouncing of macroparticles and providing electrical insulation to maximize the electric field gradients within the source. The source also includes a series of baffles which function as a filtering or trapping mechanism for any macroparticles.

22 Claims, 3 Drawing Sheets

ION SOURCE BASED ON THE CATHODIC ARC

The United States Goveernment has rights in his invention pursuant to Contract No. W-7405-ENG-48 between the United States Department of Energy and the University of California for the operation of Lawrence Livermore National Laboratory.

BACKGROUND OF THE INVENTION

The present invention is directed to an ion source, particular to an ion source using a cathodic vacuum arc, and more particularly to an ion source using a filtered cathodic arc for the production of dense, adherent coatings, wherein the filtering eliminates or reduces macroparticles normally produced by the cathodic arc.

Coatings produced by traditional physical vapor deposition (PVD) techniques, such as electron-beam evaporation and magnetron sputtering are adequate for many purposes. However, there are increasingly frequent instances where coatings produced by a PVD technique have inadequate stoichiometry, adhesion, or density.

Ion-based coating methods have the potential to produce superior coatings due to the ability to control the arrival energy of the ions. Ion sources involving vacuum arc-based processes offer the prospect for overcoming the difficulties relative to the PVD techniques by making use of their ability to provide copious quantities of ions of virtually any conductive material. Vacuum arc coating techniques generally involve use of either an anodic arc or a cathodic arc, with the cathode arc technique being of either a pulsed or continuous type.

Cathodic vacuum arc systems for coating applications are relatively new, although it has been recognized for decades that coatings could be produced using a vacuum arc. The historical background and development of vacuum arcs is set forth in an article entitled "Review of Ion-Based Coating Processes Derived from the Cathodic Arc" by David M. Sanders, *J. Vac. Sci. Technol.*, A7 (3), May/June 1989, pp. 2339-2345, and in an article entitled "Coating Technology Based on the Vacuum Arc-A Review" by D. M. Sanders et al., *IEEE Trans. Plasma Sci.*, 18 (6), pp. 883-894, 1990.

While it has been recognized for some time that cathodic arcs can provide a copious source of ions for the production of coatings in a vacuum system, it has also been recognized that such arcs normally produce chunks of material called macroparticles which lead to blemishes in the coatings thus produced. A number of approaches have been advanced for the removal of such macroparticles, which include the use of filtering and such are exemplified in the above-referenced articles. Also, see an article entitled "Transport of Plasma Streams in a Curvilinear Plasma-Optics System", *Sov. J. Plasma Phys.*, 4 (4), July-August, 1978, pp. 425-428 I. I. Aksenov et al. However, these prior approaches have not resulted in providing both an effective ion source and a means for eliminating or reducing the macroparticles produced by the cathodic arc techniques.

Therefore, there has existed a need for an ion source based on the cathodic arc which is capable of producing coatings without blemishes caused by macroparticles. The present invention fulfills the prior need by providing an ion source using the cathodic vacuum arc for producing large currents of positive ions of a wide variety of materials, wherein the ions produce coatings with improved properties such as high density and adhesion, while the coatings are essentially free of blemishes caused by macroparticles, the macroparticles having been filtered out.

SUMMARY OF THE INVENTION

An object of the present invention is to provide an ion source using a cathodic vacuum arc which operates in an arched field geometry.

A further object of the invention is to provide a cathodic vacuum arc for producing a highly ionized metal vapor for dense, adherent coatings.

A still further object of the invention is to provide an ion source using a cathodic vacuum arc and means for filtering out macroparticles produced by the cathodic arc.

Another object of the invention is to provide cathodic arc ion source which makes use of the so called "steered arc" magnetic control of the arc trajectory.

Another object of the invention is to provide an ion source using a continous, cathodic arc using a dome-shaped magnetic coil and the arc is run around the outside of a ring-shaped cathode.

Another object of the invention is to provide a cathodic arc ion source which uses an "arched" magnetic field to confine the arc track in a desired line around the circumference of the cylindrical target.

Another object of the invention is to provide a cathodic arc ion source using an "arched" magnetic field to alternately move the arc between rings of different target materials, forming multilayer coatings.

Other objects and advantages will become apparent from the following description and accompanying drawings.

The present invention involves a cathodic arc for producing dense, adherent coatings, which uses a cylindrically symmetric arc source to produce a ring of ions which leave the surface of an arc target radically. The ring-shaped cathode is surrounded by a large unveiled dome-shaped coil. The produced ions are reflected by electrostatic fields present in the source. Such fields result from the interaction of the magnetic fields produced by the coil structure around the dome and the electrons produced by the arc source. The exact magnitude and position of the electrostatic fields in space determines in large part the overall efficiency of the source. The arc source of this invention utilizes an array of electrically isolated rings which serves the dual purpose of minimizing bouncing of macroparticles and providing electrical insulation to maximize the electric field gradients within the source. In addition, the ion source utilizes a series of baffles for trapping and/or minimizing bouncing of macroparticles produced by the arc.

BRIEF DESCRIPTION OF THE DRAWINGS

The accompanying drawings, which are incorporated into and form a part of the specification, illustrate an embodiment of the invention and, together with the description, serve to explain the principles of the invention.

DETAILED DESCRIPTION OF THE INVENTION

The present invention is directed to an ion source utilizing a continuous cathodic vacuum arc as a means of producing large currents of positive ions of a wide variety of materials. The ions produced by the source of this invention can be utilized to produce coatings with improved properties such as higher density and adhesion. The ion source of this invention includes means for filtering out macroparticles normally produced by the cathodic arc thereby producing higher quality coatings. The ion source of this invention utilizes a ring-shaped cathode, and the arc runs around the outside of the cathode, which is surrounded by a large, inverted dome-shaped coil and uses an "arched" magnetic field to confine the arc track in a line around the circumference of the cylindrical target. To avoid eroding a deep groove in the target, the magnetic field can be rastered up and down the target. This arrangement can also be used to alternately move the arc between target rings of different materials, thereby forming multilayer structures. Also, the ion source of this invention incorporates electrically isolated rings which serve to trap macroparticles and/or maximize electric field gradients.

The present invention is a specific implementation of a plasma filtering strategy which has been known for some time, and involves the use of magnetic and electric fields in concert to cause ions to follow curved trajectories from the arc source to the part to be coated. Since the macroparticles produced by the same arc source follow straight trajectories, these macroparticles crash into the walls of the filter and are hence removed from the plasma stream.

Figure 1:
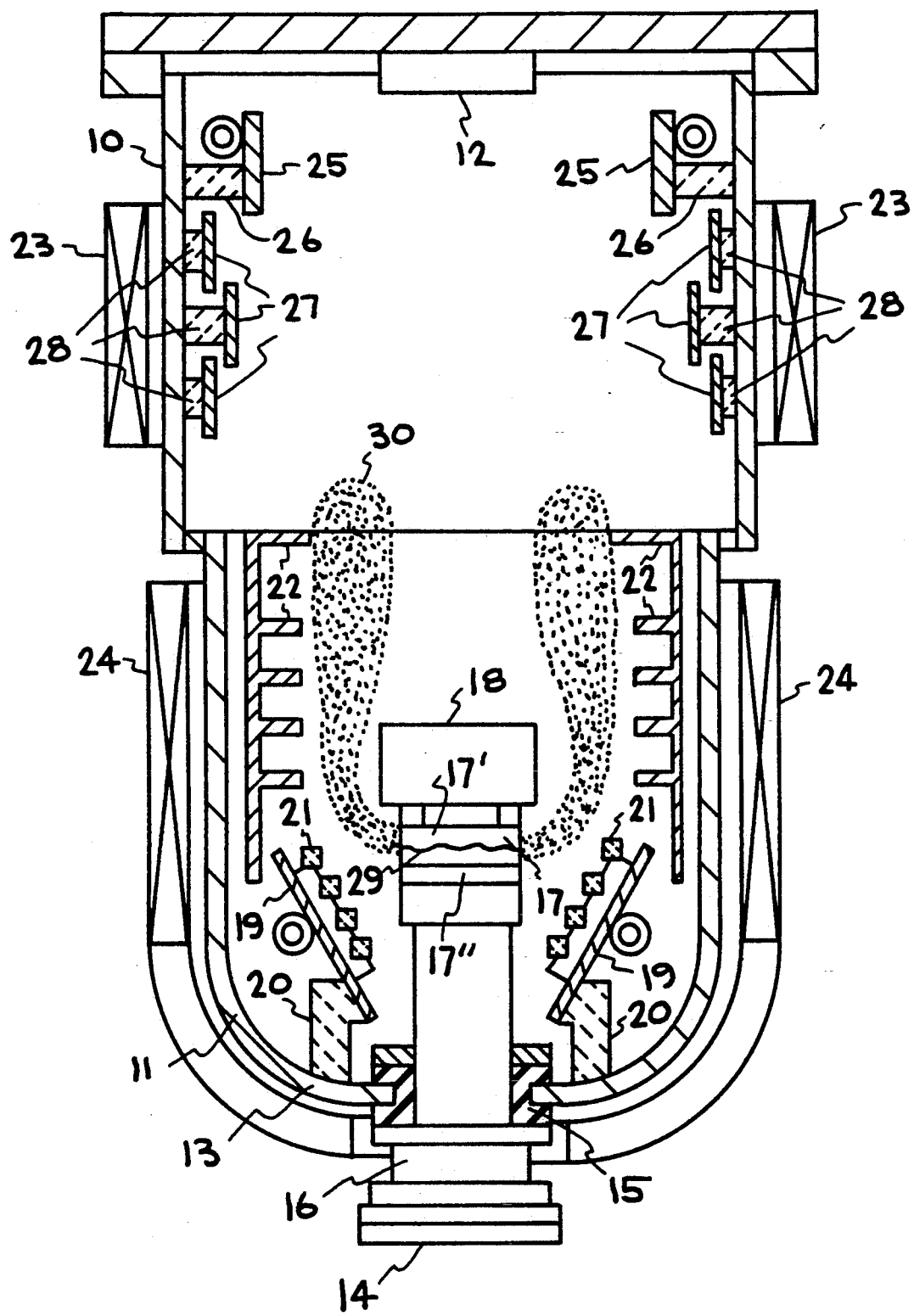
FIG. 1 schematically illustrates an embodiment of a cathodic-arc source in accordance with the invention.

Preferring now to the embodiment of the present invention illustrated in FIG. 1, the ion source comprises a vacuum chamber or housing composed of cylindrical section 10 and a dome-shaped annular section 11 having a smaller cross-section than cylindrical section 10. Cylindrical section 10 is illustrated as being open at the upper end for purposes of simplicity, and in which a part or substrate to be coated 12 is located. Cathodic-arc vacuum chambers are known in the art and thus details of the construction of the chamber and means for producing a vacuum therein are not illustrated in that such construction and details do not constitute part of this invention.

Mounted in a lower end of the dome-shaped section 11 and extending through a chamber wall 13 thereof is a feed-through or coupling assembly generally indicated at 14, having a seal 15 extending thereabout and secured to dome-shaped section 11 of the chamber by an electrically insulated coupler mechanism 16. Located within dome-shaped section 11 and mounted near the inner end of coupling assembly 14 is a water-cooled cylindrical or ring-shaped cathode or arc target 17 with an assembly 18 mounted at the inner end of coupling assembly 14, which includes a magnet structure and macroparticle shield and an anode. The assembly 18 is partially illustrated in FIG. 2 and will be described in greater detail hereinafter. An annular water-cooled, sloped or tapered anode 19 is located about coupling assembly 14 and is mounted via an insulator (ceramic standoff) 20 to the lower end of domeshaped section 11. An array or plurality of electrically insulating rings 21 are positioned adjacent anode 19 and mounted to dome-shaped section 11 by insulator means, such as ceramic standoffs, not shown. A baffle assembly having a plurality of annular baffles 22 made of non-magnetic material is secured at the interconnection between chamber sections 10 and 11 and extends into dome-section 11. Cathode or arc target 17 may be constructed of a plurality of rings (indicated at 17' and 17") of different materials to provide for multilayer coating.

While not shown, power cables or lines from a power source, not shown, are connected to assembly 18, and anode 19. Also cooling lines or tubes, not shown, extend through coupling 14 and connect a water-cooled shaft, not shown, in the center of the ring-shaped target 17 and water cooled anode 19 with an externally located coolant supply. Water cooling of the cathodes (targets) and anodes is well known in the art. Also, a control cable, not shown, may extend through coupling 14 and be operatively connected to components of assembly 18 to enable the assembly 18 to function as discussed hereinafter. In addition, the coils are connected to a pair of computer-controlled power supplies, not shown, to vary the currents in the coils, and uses software to control the current to each in a defined oscillation. Variation in currents is 180° out of phase between the two coils.

A cylindrical coil 23 extends around the exterior of cylindrical chamber section 10 and an annular dome-shaped coil 24 extends around the exterior of dome-shaped chamber section 11 and are each connected to a variable power supply, not shown. A cylindrical anode 25 is positioned within the cylindrical chamber section 10 and mounted thereto via an insulator 26, and an array or plurality of insulating rings 27 are position in alignment with anode 25 and secured to chamber section 10 via insulators 28 such as ceramic standoffs. While not shown, electrical and water cooling lines connect anode 25 to appropriate power and cooling sources.

Figure 2:
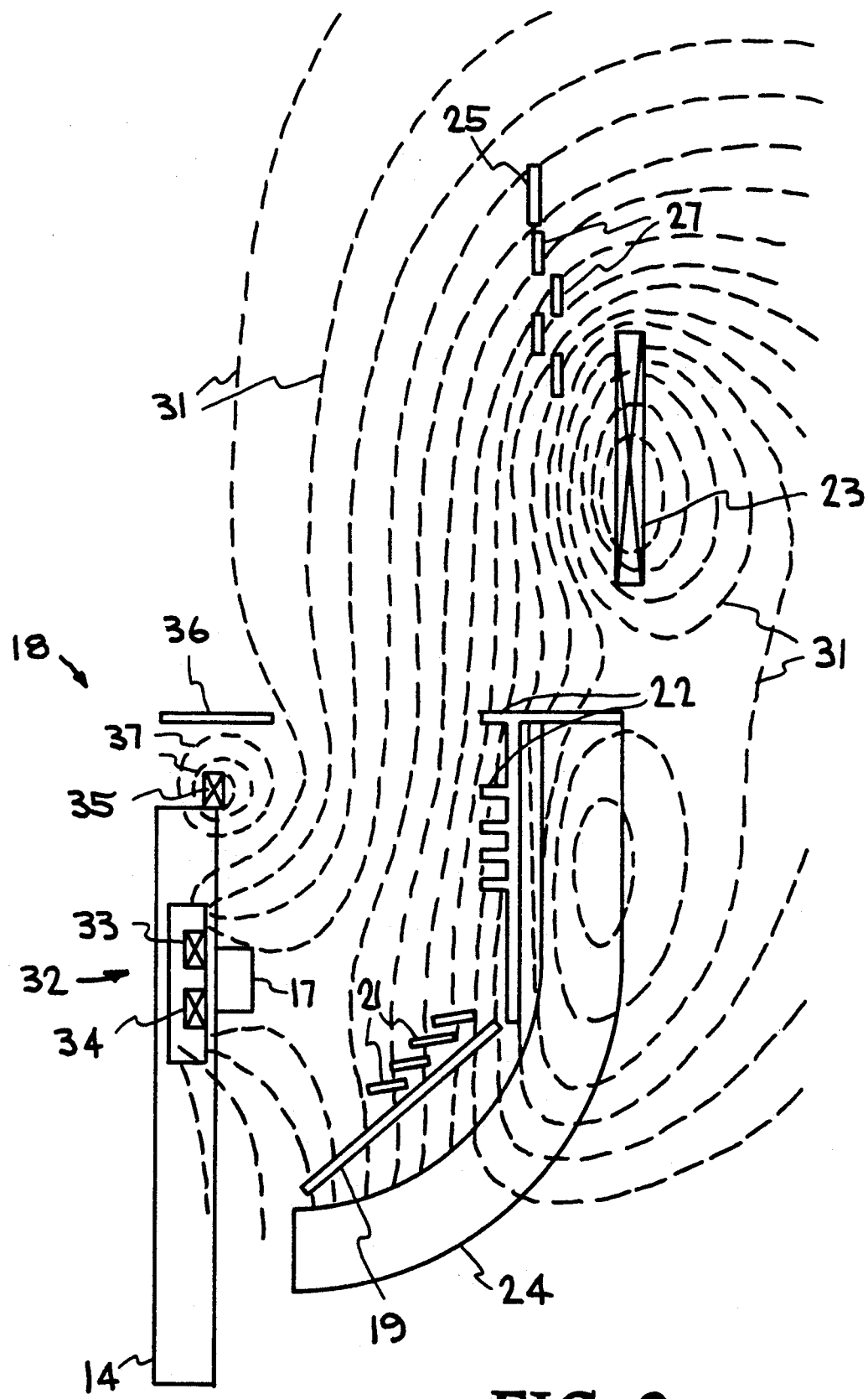
FIG. 2 is a view illustrating the magnetic field lines of the FIG. 1 embodiment.

In operation, and as illustrated in FIGS. 1 and 2, an arc is initiated within dome-shaped chamber 11, as known in the cathodic arc technology, and the arc runs around the outside of the ring-shaped target or cathode 17, leaving an arc track 29 which produces a ring of ions 30 which leave the surface of the arc target 17 radially, as seen in FIG. 1. The ions 30 are reflected by the electrostatic fields within dome-shaped chamber 11 and move upwardly toward the part or substrate 12 to be coated. FIG. 2 illustrates the magnetic field lines at 31 which extend from coils 23 and 24 and the electrostatic fields result from the interaction of the magnetic fields produced by dome-shaped coil 24 and the electrons produced by the arc source. Note in FIG. 2 that the insulating rings 21 and 27 are located in the areas where the magnetic field lines from coils 24 and 23 pass through the chamber wall. The exact magnitude and position of the electrostatic fields in space determines to a large extent the overall efficiency of the source. As shown in FIG. 2, the assembly 18 includes an arc-control electromagnet 32 located behind arc target 17, which is connected to a control system, such as a computer activated controller, not shown, but the function thereof is described hereinafter.

The source within dome-shaped chamber section 10 uses an "arched" magnetic field to confine the arc track 29 in a line around the circumference of the cylindrical target 17, which for example, may be 7.5 cm in diameter. Both north and south poles of the magnetic field within the source are placed inside the target 17. The magnetic field lines go through the target radially, then bend back into the target a short, axial distance above, such that the configuration is axisymmetric. The arc spot drifts rapidly around the circumference of the target (in the-EXB direction), and tends to track at the point on the target where the magnetic field is parallel to the target surface. To avoid eroding a deep groove at this point on the target, the magnet field is rastered up and down the target 17 by adjusting the current of two coils 33 and 34 of arc-control electro-magnet 32, positioned within a water-cooled shaft in the center of the ring-shaped target 17. This arrangement also is used to alternately move the arc track 29 between rings 17' and 17" of different target materials, thus forming multilayer structures or coatings on part 12. Assembly 18, as shown in FIG. 2 also includes a permanent magnet 35 and a macroparticle baffle 36. As seen in FIG. 2, the magnet 35 produces field lines indicated at 37 which direct the ions from arc target 17 around the baffle 36, while only macro-particles strike the baffle 36 causing them to bounce back toward the target 17 and/or toward baffles 22.

The array or plurality of insulating rings 21 serves the dual purpose of filtering or minimizing bouncing of macroparticles produced from target 17 and providing electrical insulation to maximize the electric field gradients within the source, which in turn, maximizes source efficiency. The flow of electrons through the macroparticle filter produces the electrostatic field required to guide the ions. The magnetic field used is not strong enough to influence the ion trajectories directly, but the 50-200 G field constrains the electrons strongly. Limiting cross-field motion of the electrons allows an electrostatic potential to build in the system, which in turn, guides the ions. Any cross-field conducting surfaces will reduce the potentials produced, and reduce the ion transport efficiency through the filter. The direction of the magnetic field (see FIG. 2) produced by the dome coil 24 is opposite to that of the arched-field through the target, which leads to a "point" or area of low magnetic field which allows the electrons to flow more easily to the anode 19, reducing the arc voltage required to operate the source. Also, it is this flow of electrons to the upper anode 25 that creates the electrostatic fields that guide the ions out of the source and onto substrate or part 12 to be coated.

Figure 3:
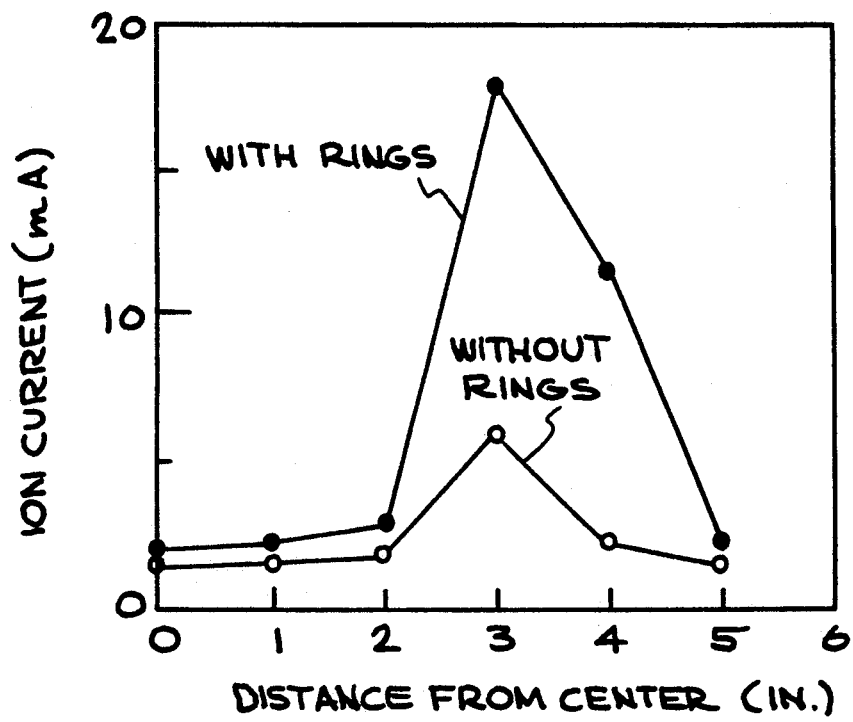
FIG. 3 is a diagram illustrating the increase in ion currents as the result of the insulating rings of the embodiment of FIG. 1.

FIG. 3 illustrates the ion current or transmission with and without the insulating rings 21 and 27 using a biased probe scanned across the top of the source. As can be seen by comparison, without the insulating rings (lower profile in FIG. 3) the ion transmission was low, and it was theorized that the magnetic field lines were effectively shorted when they crossed the vacuum chamber walls, lowering the potentials generated to bend the ion trajectories. By adding the insulating rings 21 and 27 to insulate the vacuum chamber walls, where each of the magnetic field lines from coils 23 and 24 cross the walls, the ion transmission or measured current profile increased as seen in the upper curve of FIG. 3. The addition of the insulating rings resulted in an increase in ion current from 1 to 3 amps.

Filtering of the macroparticles produce by the arc source from target 17 is accomplished by the array of insulating rings 21 and the baffles 22. The macroparticles follow in straight trajectories and thus normally crash into the walls of the vacuum chamber or are bounced back into the stream of ions whereby some reach the part 12 to be coated, thereby forming blemishes on the coated part. However, the array of insulating rings 21 function to trap the macroparticles and those which do bounce from the rings 21 are trapped by the baffles 22, thereby eliminating or substantially reducing the probability of the macroparticles reaching to part 12 to be coated by the flow of ions from the target 17.

It is thus seen that the ion source of this invention operates in an arched field geometry which means that the position of the arc can be controlled using the arc-control electromagnet structure 32 of FIG. 2, which is located within the arc target or cathode 17 so as to be under the surface of the arc target 17. The following example illustrates the capabilities of the present invention for producing titanium nitride (TiN) coatings.

The substrates 12 are first cleaned in situ with a DC sputter-etch in argon. The parameters are not critical; we used a 2 kV bias at 20 mTorr argon pressure for 2-5 minutes. For the coating run, the current in the main dome coil 24 was 25 amps and the current in the coil 23 at the top of the dome was 160 amperes. The currents in the two coils inside the target mandrel were continuously varied from 3 to 13 amperes, out of phase with each other, to provide the rastering of the arc track on the target. This delayed the formation of deep grooves in the target surface, which limit the life of the target. During the run, both argon and nitrogen were introduced to the chamber. The iris valve on the turbomolecular pump was closed down to 8% of full open to limit the gas flows needed to maintain the gas pressure in the chamber. The argon flow was set using a manual leak valve to be 0.2 mTorr. This stabilized the arc, reducing the number of times the arc would extinguish spontaneously. A nitrogen flow of 300 sccm was added during the run, which raised the total pressure in the chamber during the run to 0.43 mTorr. The pressure was low due to the gettering effect of the fresh titanium coating on the chamber walls, and after the run was terminated, the pressure in the chamber would rise to 7 to 8 mTorr. The arc current was 100 amperes, with an arc voltage of 37-38 volts. These conditions produced a coating of 1-2 kÅ per minute.

It has thus been shown that the present invention provides an ion source which operates in an arched field geometry and utilizes a cylindrical symmetric arc source or target to produce a ring of ions which leave the surface of the arc target radially and are reflected by electrostatic fields within the source to a point of use (part to be coated). Also, any macroparticles produced leave the surface of the arc target radially, and such are trapped by the array of insulating rings and the baffle assembly located within the source, thereby improving the quality of the coating on a part. In addition, the invention incorporates an arc-control electromagnet assembly which enables moving of the arc track on the surface of the arc target to prevent eroding a deep groove in the arc target, and also to enable multilayer coatings when the arc target is constructed of rings of different materials.

While a particular embodiment of the invention has been illustrated and described, and specific examples of coatings produced by the invention have been described, such is not intended to limit the invention to any specific embodiment or for the production of any specific coatings. Modifications and changes of the illustrated ion source will become apparent to those skilled in the art, and those skilled in the art will recognize that the ion source has the capability of use in many types of applications. It is intended that the invention is to be limited only by the scope of the appended claims.

We claim:

1. An ion source utilizing a cathodic arc to produce a highly ionized metal vapor useful in the production of dense, adherent coatings, comprising:
 a vacuum chamber having a dome-shaped section at one end thereof;
 an annular cathode constituting an arc target located within said dome-shaped section of said vacuum chamber;
 an annular anode located within said dome-shaped section of said vacuum chamber and spaced from said cathode;
 a magnetic coil located external of said vacuum chamber and adjacent said dome-shaped section;
 a plurality of insulating rings located within said dome-shaped section of said vacuum chamber intermediate said cathode and a portion of said anode;
 baffle means located within said dome-shaped section of said vacuum chamber; and
 means for moving an arc spot on said arc target;
 whereby a ring of ions leave the arc target in a radial direction and are reflected by electrostatic fields within said dome-shaped section of said vacuum chamber toward a point of use, and whereby any macroparticles produced by the arc target move in a radial direction and are trapped by said plurality of insulating rings and said baffle means.

2. The ion source of claim 1, wherein said plurality of insulating rings are located at a point within said dome-shaped section of said vacuum chamber where magnetic field lines from said coil pass through walls of said vacuum chamber.

3. The ion source of claim 1, wherein said annular anode has a tapered configuration, with said plurality of insulating rings being located adjacent one end of the tapered anode; and said coil having a dome-shaped configuration.

4. The ion source of claim 1, wherein said vacuum chamber additionally includes a cylindrical section connected to said dome-shaped section, said cylindrical section of vacuum chamber being provided therein with an anode, and a plurality of insulating rings, and having a magnetic coil extending around an exterior portion thereof, whereby electrostatic forces are produced for directing a stream of ions from said dome-shaped section of said vacuum chamber to a point of use.

5. The ion source of claim 4, wherein said plurality of insulating rings located in said cylindrical section of said vacuum chamber are positioned intermediate said baffle means and said anode of said cylindrical section.

6. The ion source of claim 1, wherein said means for moving an arc spot on said arc target includes an arc-control electromagnet assembly located within said cathode.

7. The ion source of claim 1, wherein said cathode is constructed of a single material.

8. The ion source of claim 1, wherein said cathode, constituting said arc target, is constructed of a plurality of ring-sections, each ring-section being composed of a different material.

9. The ion source of claim 1, wherein at least said anode is provided with water cooling means.

10. In a cathodic vacuum arc ion source having a cathode and an anode located within a vacuum chamber and a magnetic coil located exterior of said chamber whereby electrostatic fields are produced for directing ions from said source to a point of use, the improvement comprising:
 said cathode having a cylindrical configuration whereby ions and macroparticles produced from an arc track extending around said cathode leave a surface of said cathode in a radially outward direction;
 an array of insulating rings positioned within said chamber and intermediate said cathode and at least a section of said anode; and
 baffle means positioned within said chamber and adjacent said array of insulating rings;
 whereby ions leaving said surface of said cathode are bent by electrostatic fields within said vacuum chamber for directing same to a point of use, while macroparticles leaving said surface of said cathode are trapped by said array of insulating rings and said baffle means.

11. The improvement of claim 10, additionally including means for moving said arc track onto different surfaces of said cathode.

12. The improvement of claim 11, wherein said means for moving said arc tracks includes an arc-control electromagnet assembly located within said cathode.

13. The improvement of claim 12, wherein said arc-control electromagnet assembly comprises:
 a pair of annular electromagnetics located behind a surface of said cathode.

14. The improvement of claim 11, wherein said cathode is constructed of a plurality of cylindrical sections each composed of a different material.

15. The improvement of claim 10, additionally including a baffle located vertically above said cathode, and a permanent magnet located intermediate said baffle and said cathode.

16. The improvement of claim 10, wherein said vacuum chamber includes a dome-shaped section, said cathode, anode, array of insulating rings, and wherein said baffle means is located within said dome-shaped section of said vacuum chamber.

17. The improvement of claim 16, wherein said coil is of a dome-shaped configuration, and wherein said array of insulating rings is positioned at a location where magnetic field lines produced in said coil pass through a wall of said dome-shaped section of said vacuum chamber.

18. The improvement of claim 17, wherein said baffle means comprises an assembly positioned adjacent to a wall of said vacuum chamber and having a plurality of annular inwardly extending baffles, said baffle assembly being located intermediate said arrays of insulating rings.

19. The improvement of claim 16, wherein said vacuum chamber includes a cylindrical section attached to said dome-shaped section, and additionally including a second anode and a second array of insulating rings positioned within said cylindrical section, and a second coil positioned around an exterior wall of said cylindrical section.

20. A method for producing ions from a target material for coating a part, comprising the steps of:
 positioning within a vacuum chamber a cylindrical cathode formed of material to be coated on a part;
 positioning within the vacuum chamber an annular anode in spaced relation to the cathode;
 positioning within the vacuum chamber an array of insulating rings located intermediate the cathode and at least a portion of the anode;

locating a magnetic coil about the exterior of the section of the vacuum chamber containing the cathode, anode, and array of insulating rings;

providing the interior of the vacuum chamber with an annular baffle assembly positioned adjacent an interior wall thereof and adjacent the array of insulating rings;

providing electrical power to said coil, said cathode, and said anode so as to produce an arc on the surface of the cathode causing the formation of at least ions and macroparticles; and providing means for changing the location of an arc track on the cathode;

whereby ions and macroparticles leaving the surface of the cathode move in a radially outwardly direction, wherein the ions are reflected by electrostatic fields formed within the vacuum chamber toward a point of use, and wherein the macroparticles are essentially all trapped by the array of insulating rings and the baffle assembly so as to minimize passage of macroparticles along with the ions to a point for coating a part with the material of the cathode.

21. The method of claim 20, additionally including the step of forming the cylindrical cathode so as to be composed of a plurality of sections of different materials, whereby actuation of the means for changing location of an arc track on the cathode causes the arc track to move to the different sections of material, thereby producing a coating on a part with layers of different material.

22. The method of claim 20, additionally including the steps of forming a section of the vacuum chamber in a dome-shaped configuration, positioning the cathode, anode, insulating rings and baffle assembly in the dome-shaped section, and forming the coil in a dome-shaped configuration located adjacent the dome-shaped section.

* * * * *